(12) United States Patent
Huang et al.

(10) Patent No.: US 6,979,638 B2
(45) Date of Patent: Dec. 27, 2005

(54) CONDUCTING WIRE AND CONTACT OPENING FORMING METHOD FOR REDUCING PHOTORESIST THICKNESS AND VIA RESISTANCE

(75) Inventors: Tse-Yao Huang, Taipei (TW); Yi-Nan Chen, Taipei (TW); Chiang-Lin Shih, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/783,014

(22) Filed: Feb. 23, 2004

(65) Prior Publication Data

US 2005/0186775 A1    Aug. 25, 2005

(51) Int. Cl.[7] .......................................... H01L 21/4763
(52) U.S. Cl. ...................... 438/622; 438/637; 438/672
(58) Field of Search ................................. 438/622, 637, 438/672, FOR 355, FOR 489

(56) References Cited

U.S. PATENT DOCUMENTS

| | | | | |
|---|---|---|---|---|
| 5,529,955 A | * | 6/1996 | Hibino et al. | 438/627 |
| 5,756,395 A | * | 5/1998 | Rostoker et al. | 438/622 |
| 6,124,194 A | * | 9/2000 | Shao et al. | 438/600 |
| 6,140,225 A | * | 10/2000 | Usami et al. | 438/637 |
| 6,225,217 B1 | * | 5/2001 | Usami et al. | 438/637 |
| 6,368,951 B2 | * | 4/2002 | Higashi et al. | 438/618 |

* cited by examiner

*Primary Examiner*—George Fourson
*Assistant Examiner*—Michelle Estrada
(74) *Attorney, Agent, or Firm*—Bacon & Thomas

(57) ABSTRACT

Disclosed is a method for forming conducting wire and contact opening in a semiconductor device. The method of the present invention utilizes the formation of metal regions as a mask for etching a conductive layer of the semiconductor device to remove unnecessary portions so as to form conducting wires. The method of the present invention can reduce the necessary thickness of photoresist and well control the via resistance.

6 Claims, 7 Drawing Sheets

CONDUCTING WIRE AND CONTACT OPENING FORMING METHOD FOR REDUCING PHOTORESIST THICKNESS AND VIA RESISTANCE

BACKGROUND OF THE INVENTION

1. Field of the Invention

The present invention relates to a process for conducting wire and contact opening in semiconductor structure, more specifically, to a method for reducing photoresist thickness and via resistance in conducting wire process.

2. Description of the Prior Art

In manufacturing semiconductor devices such as DRAM, the process for forming conducting wires is very important.

A conventional process for forming conducting wires will be described with reference to FIG. 1.

First, a first dielectric layer 12 is formed on a semiconductor substrate 10. The first dielectric layer 12 is dug to form a via 14, and the via 14 is filled with metal. The resultant structure is shown in FIG. 1a.

Then, on the first dielectric layer 12 comprising the via 14 filled with metal, a conductive layer 16 is formed. In practical process, the conductive layer 16 comprises a metal layer 160 of aluminum, aluminum/copper or any other suitable material, and thin Ti/TiN protective layers 162, 164 formed on the bottom and top of the metal layer 160, as shown in FIG. 1b.

Subsequently, as shown in FIG. 1c, a photoresist layer comprising photoresist portions 182, 184 and 186 is formed on the structure of FIG. 1b, in order to remove undesired portions of the conductive layer 16 to form recesses 15, as shown in FIG. 1d. The remaining portions of the conductive layer 16 form conducting wires.

However, in the step of forming the photoresist layer, since the photoresist must have considerable thickness, the aspect ratio of certain photoresist portion is large. When the aspect ratio of the photoresist portion exceeds a certain degree, it intends to incline or even collapse, as indicated by the reference number 186' in FIG. 1c'. If the photoresist portion inclines or collapses, the accuracy of the etched profile is degraded, causing the pattern consisting of the remaining metal portions after etching is different from the predetermined pattern.

In the subsequent process for forming a contact opening, a second dielectric layer 152 is formed to fill the recesses 15. Then, planarization is performed. A third dielectric layer 17 is formed on the entire structure, as shown in FIG. 1e.

On the third dielectric layer 17, a photoresist layer 19 is formed, as shown in FIG. 1f.

Finally, a contact opening 175 is opened by etching process, and the photoresist layer 19 is removed, as shown in FIG. 1g. However, in the etching process, the protective layer 164 of the conducting wire corresponding to the contact opening 175 is often undesirably etched off, resulting in the damage to the conducting wire, and causing the via resistance increases.

Therefore, a solution for solving the above problems is needed. The present invention satisfies such a need.

SUMMARY OF THE INVENTION

An objective of the present invention is to provide a method for forming conducting wire and contact opening in semiconductor structure, which can reduces the required thickness of photoresist used in the process.

Another objective of the present invention is to provide a method for forming conducting wire and contact opening in semiconductor structure, by which the via resistance can be reduced.

In accordance with an aspect of the present invention, a method for forming conducting wire and contact opening in semiconductor structure comprises steps of providing a substrate; forming a first dielectric layer on the substrate; forming a via in the first dielectric layer, and filling the via with metal; forming a conductive layer on the first dielectric layer having the via; forming a second dielectric layer on the conductive layer; removing a portion of the second dielectric layer corresponding to a position where a contact opening is to be formed to form an opening; filling the opening with metal to form a metal region; removing the second dielectric layer; using the metal region as a mask to remove undesired portions of the conductive layer to form conducting wires; filling recesses between the conducting wires with a filling layer and performing planarization to expose the conducting wire; forming a third dielectric layer on the filling layer and the conducting layer; forming a photoresist layer with a predetermined pattern on the third dielectric layer; removing a predetermined portion of the third dielectric layer to from a contact opening; and removing the photoresist layer.

In accordance with another aspect of the present invention, in the method for forming conducting wire and contact opening in semiconductor structure, the etching selectivity ratio for the conductive layer to the metal region is higher than 3:1.

In accordance with a further aspect of the present invention, in the method for forming conducting wire and contact opening in semiconductor structure, the conductive layer comprises mainly aluminum, while the metal region comprises mainly tungsten.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETIALED DESCRIPTION OF THE PREFERRED EMBODIMENT

An embodiment of the present invention will be described in detail with reference to the accompanying drawings.

Figure 1A:
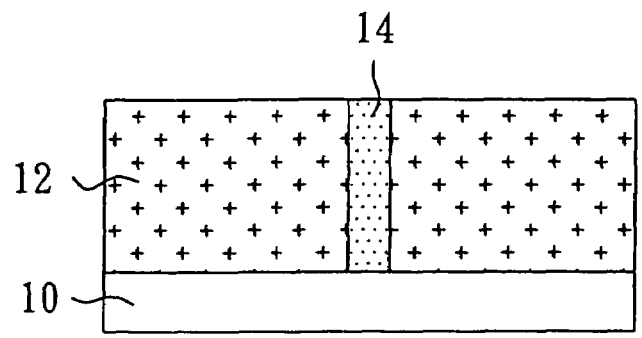
FIGS. 1a to 1c, 1c' and 1d to 1g are schematic sectional diagrams illustrating the respective steps of a conventional method for forming conducting wire and contact opening.
Figure 1B:
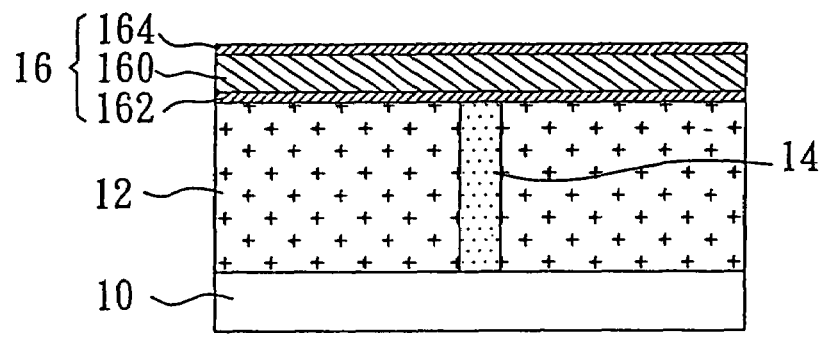
Figure 1C:
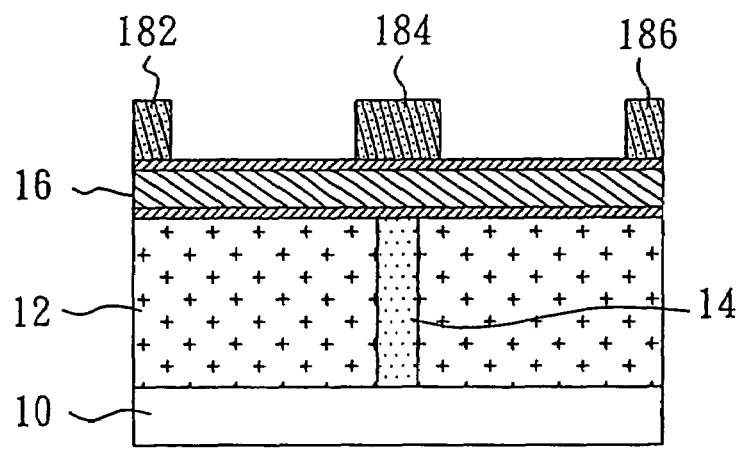
Figure 1C:
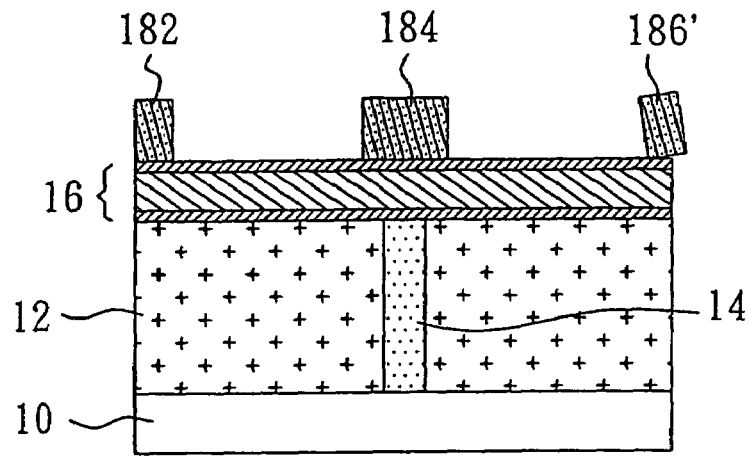
Figure 1D:
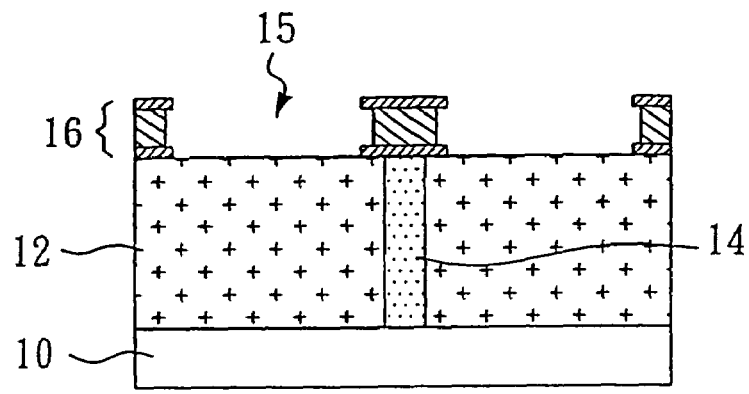
Figure 1E:
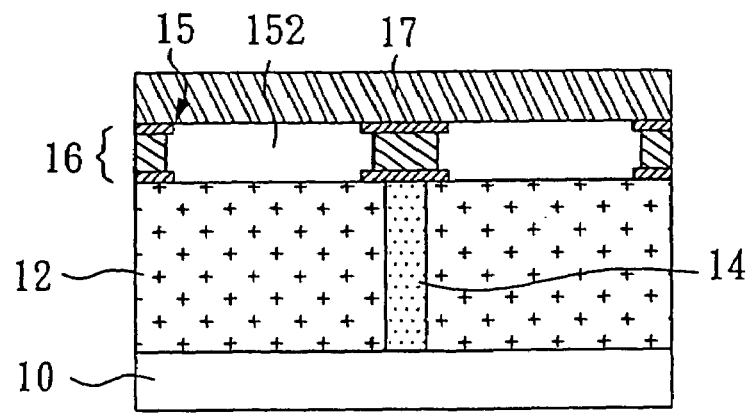
Figure 1F:
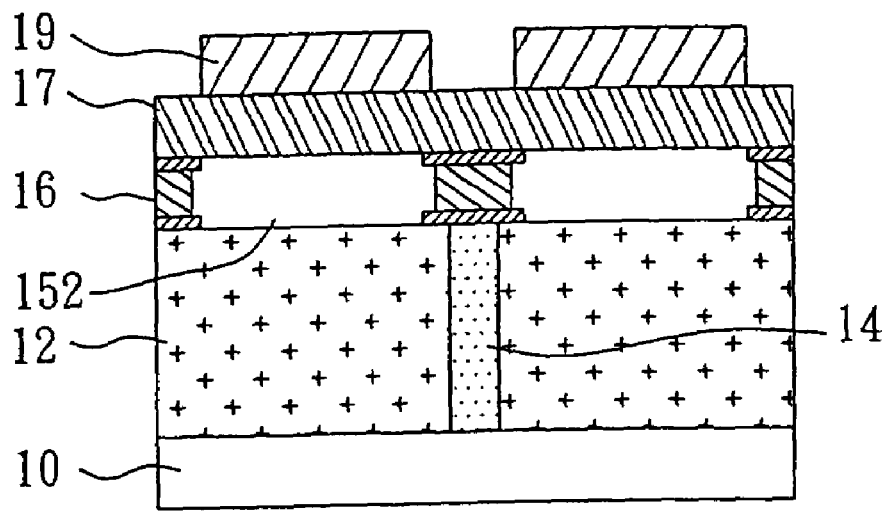
Figure 1G:
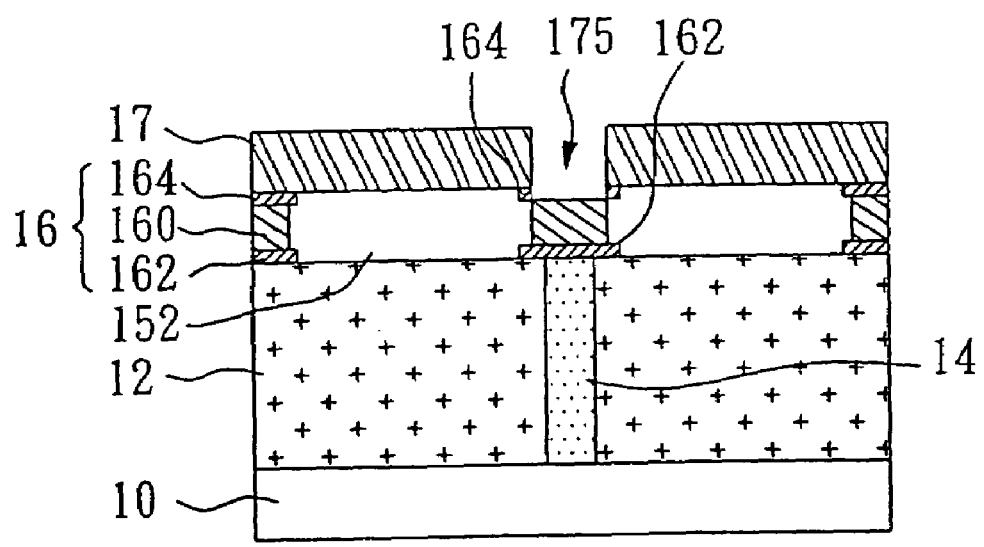
Figure 2A:
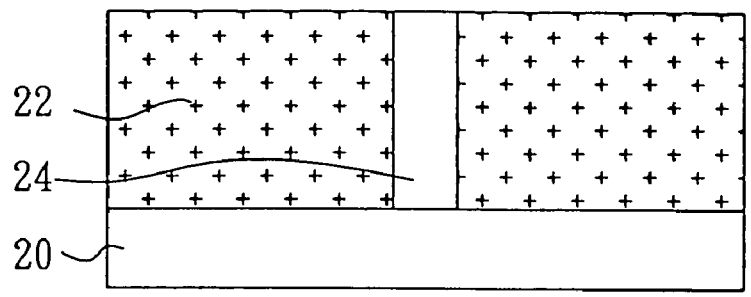
FIGS. 2a to 2j are schematic sectional diagrams illustrating the respective steps of a method for forming conducting wire and contact opening in accordance with the present invention.
Figure 2B:
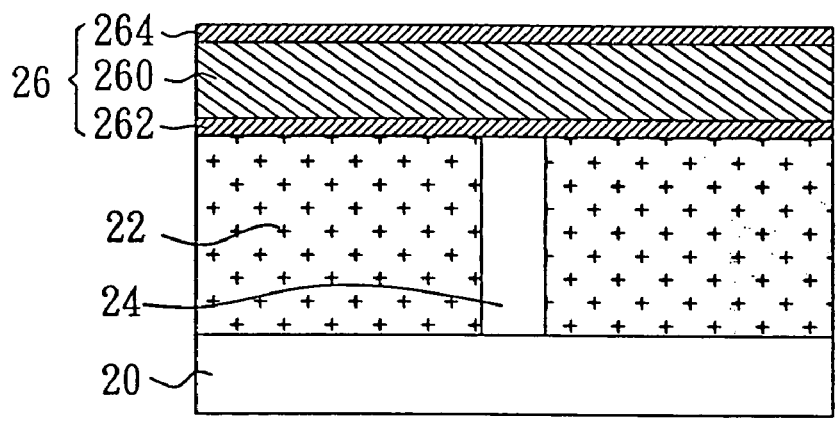

The structures shown in FIGS. 2a and 2b are the same as those shown in FIGS. 1a and 1b, and therefore the descriptions thereof are omitted herein. In the drawings, reference number 20 indicates a substrate, 22 indicates a first dielectric layer, 24 indicates a via filled with metal, 26 indicates a conductive layer, which includes a metal layer 260 of aluminum, and protective layers 262 and 264 formed on the top and bottom of the metal layer 260. The material of the protective layers can be Ti/TiN.

Figure 2C:
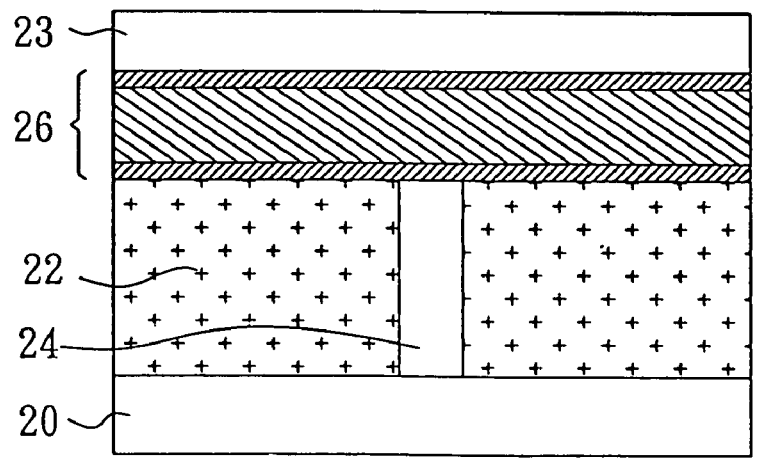
Figure 2D:
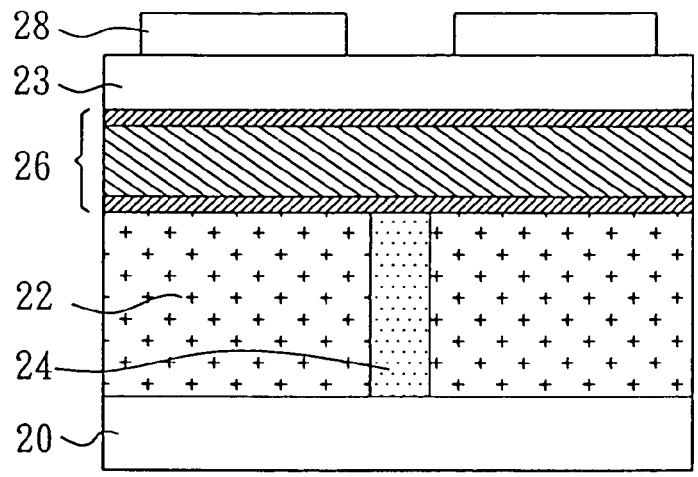
Figure 2E:
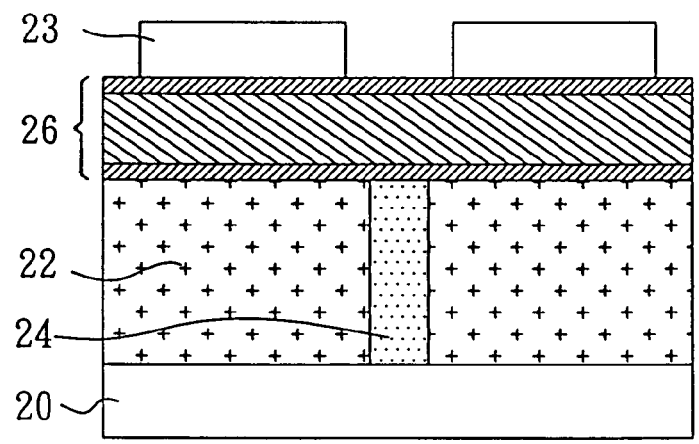

A second dielectric layer 23, of which the material can be oxide, preferably NSG (non-doped silicon glass), is formed on the conductive layer 26, as shown in FIG. 2c. Then, a photoresist layer 28 of a predetermined pattern is formed on the second dielectric layer 23 to define the position where a contact opening is to be formed, as shown in FIG. 2d. The portions of the second dielectric layer 23 not covered by the photoresist layer 28 are removed by etching to form openings, and then the photoresist layer 28 is removed. The resultant structure is shown in FIG. 2e.

Figure 2F:
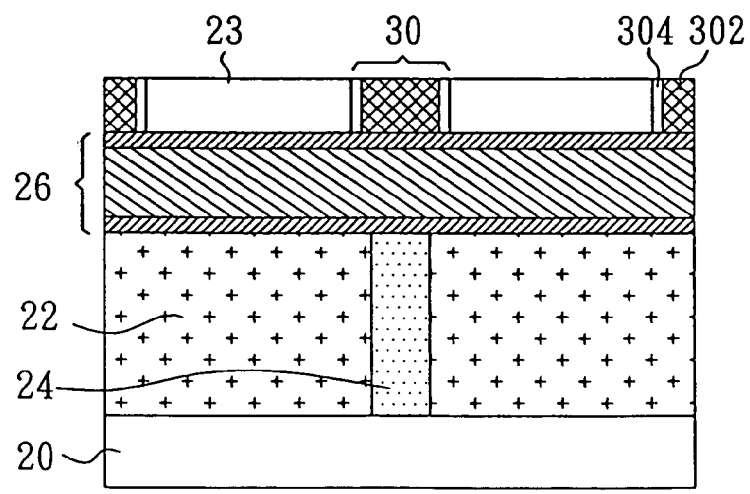

With reference to FIG. 2f, the openings formed in the second dielectric layer 23 are filled with metal to form metal regions 30. In the this embodiment, the metal region 30 mainly comprises tungsten (W) 302 and protective layera 304 of TiN/Ti.

Figure 2G:
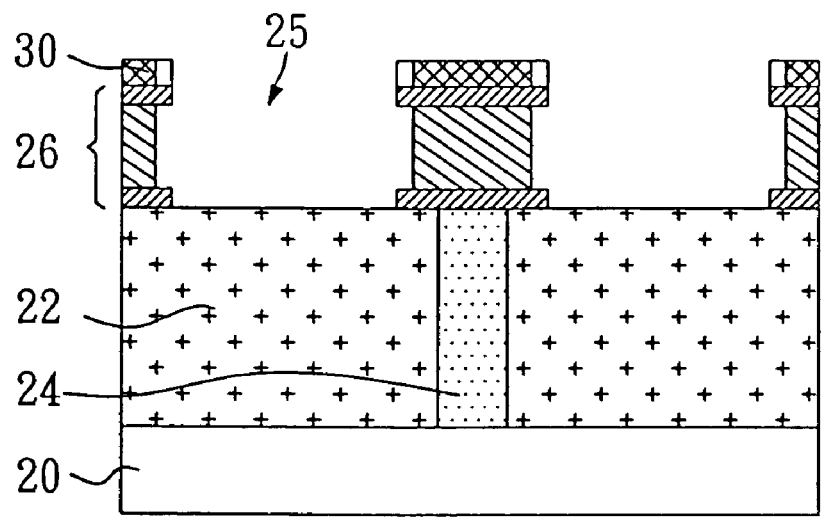

Next, the second dielectric layer 23 is removed by etching. The metal regions 30 are used as a hard mask for etching the conductive layer 26. The portions of the conductive layers 26 not covered with the metal regions 30 are removed to form recesses 25. The remaining portions of the conductive layer 26 serve as conducting wires. In this embodiment, the material of the conductive layer 26 is mainly aluminum, while the material of the metal region is mainly tungsten. The etching selectivity ratio for aluminum with respect to tungsten is about 3:1 to 4:1. Accordingly, in the process of etching the conductive layer 26, although some of the metal region is also etched, a part of the metal region is retained, as shown in FIG. 2g.

Figure 2H:
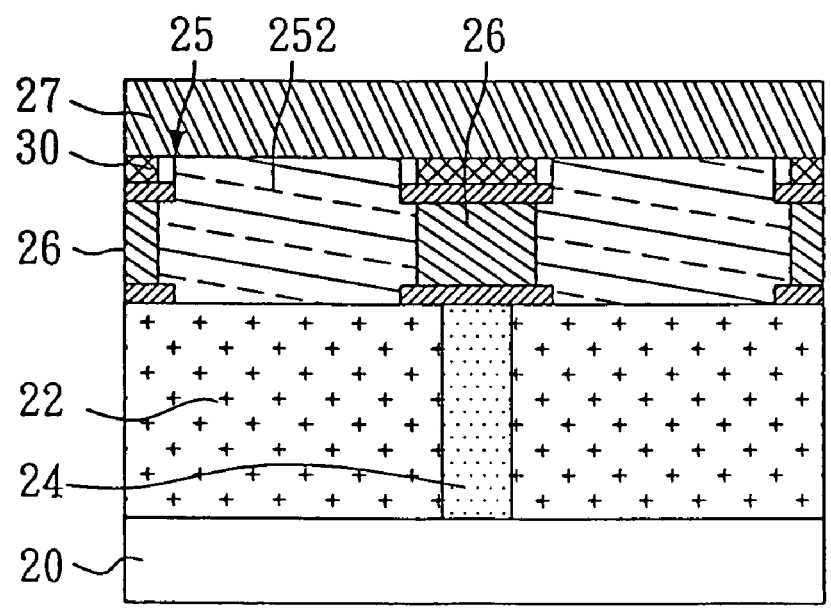

In the subsequent process for forming a contact opening, a filling layer 252, which comprises dielectric material, is filled into the recesses 25. Then, planarization is performed to expose the retained metal. A third dielectric layer 27 is formed on the whole structure, as shown in FIG. 2h.

Figure 2I:
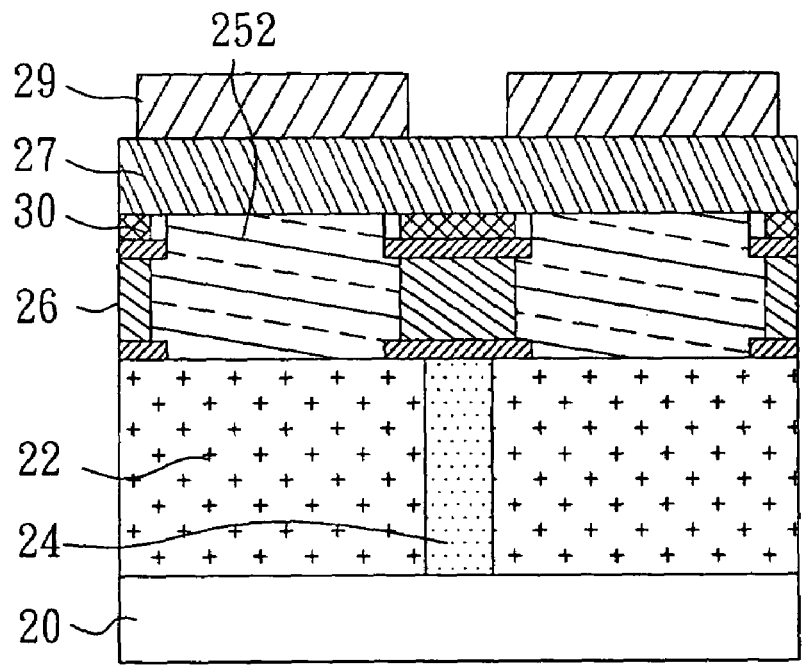

On the third dielectric layer 27, a photoresist layer 29 of a predetermined pattern is formed, as shown in FIG. 2i.

Figure 2J:
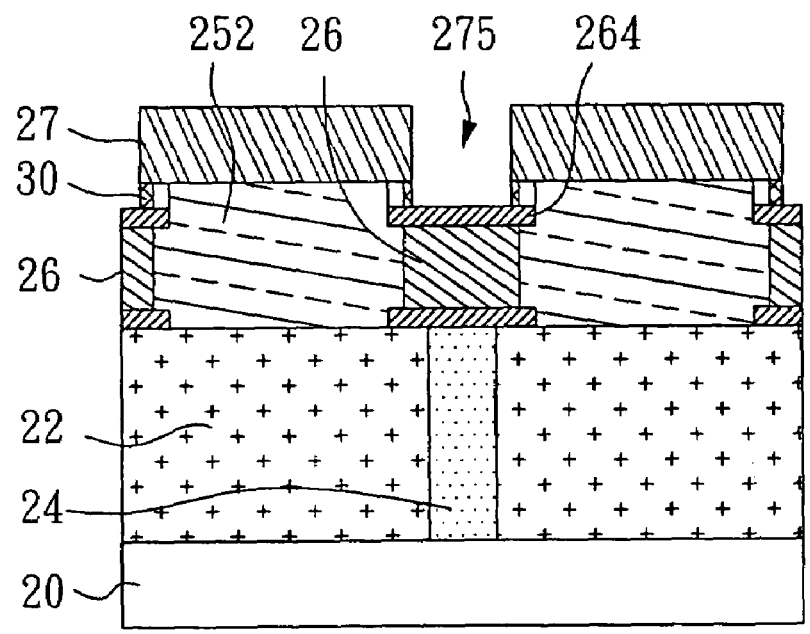

Finally, an undesired portion of the third dielectric layer 27 is removed by etching to form a contact opening 275, and the photoresist layer is removed, as shown in FIG. 2j. As can be seen from the drawing, in the process of opening the contact opening 275, due to the effect of the metal region 30, the etching is stopped before the protective layer 264 of the conductive layer 26. According, the integrity of the conducting wire can be maintained, and therefore the via resistance can be well controlled and reduced.

While the embodiments of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming conducting wire in semiconductor device, said method comprising steps of:
   providing a substrate;
   forming a first dielectric layer on the substrate;
   forming a via in the first dielectric layer, and filling the via with metal;
   forming a conductive layer on the first dielectric layer including the via;
   forming a second dielectric layer on the conductive layer;
   removing portions of the second dielectric layer to form openings;
   filling the openings with metal to form metal regions;
   removing the second dielectric layer; and
   using the metal regions as a mask to remove undesired portions of the conductive layer by etching to form conducting wires.

2. The method as claimed in claim 1, wherein the etching selectivity ratio for the conductive layer to the metal region is higher than 3:1.

3. The method as claimed in claim 2, wherein the conductive layer mainly comprises aluminum, while the metal region mainly comprises tungsten.

4. A method for forming conducting wire and contact opening in semiconductor device, said method comprising steps of:
   providing a substrate;
   forming a first dielectric layer on the substrate;
   forming a via in the first dielectric layer, and filling the via with metal;
   forming a conductive layer on the first dielectric layer including the via;
   forming a second dielectric layer on the conductive layer;
   removing portions of the second dielectric layer to form openings;
   filling the openings with metal to form metal regions;
   removing the second dielectric layer;
   using the metal regions as a mask to remove undesired portions of the conductive layer by etching to form conducting wires;
   filling recesses between the conducting wires with a filling layer, and performing planarization to expose the metal regions;
   forming a third dielectric layer on the filling layer and the metal regions;
   forming a photoresist layer with a predetermined pattern on the third dielectric layer;
   removing a predetermined portion of the third dielectric layer to from a contact opening; and
   removing the photoresist layer.

5. The method as claimed in claim 4, wherein the etching selectivity ratio for the conductive layer to the metal region is higher than 3:1.

6. The method as claimed in claim 5, wherein the conductive layer mainly comprises aluminum, while the metal region mainly comprises tungsten.

* * * * *